(12) United States Patent
Miki (10) Patent No.: US 8,455,358 B2
(45) Date of Patent: Jun. 4, 2013

(54) METHOD OF MANUFACTURING VIA HOLE IN A SEMICONDUCTOR DEVICE

(75) Inventor: Kohei Miki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/227,577

(22) Filed: Sep. 8, 2011

(65) Prior Publication Data

US 2012/0115327 A1 May 10, 2012

(30) Foreign Application Priority Data

Nov. 5, 2010 (JP) ................................. 2010-248451

(51) Int. Cl.
  *H01L 21/44* (2006.01)
(52) U.S. Cl.
  USPC ..... 438/667; 438/672; 438/678; 257/E21.597
(58) Field of Classification Search
  USPC ................... 438/667, 672, 678; 257/E21.597
  See application file for complete search history.

(56) References Cited

U.S. PATENT DOCUMENTS

| 7,060,526 | B2 * | 6/2006 | Farnworth et al. | 438/106 |
| 8,003,525 | B2 | 8/2011 | Okamoto | |
| 8,278,685 | B2 * | 10/2012 | Takagi | 257/192 |
| 2005/0133874 | A1 * | 6/2005 | Goda et al. | 257/374 |
| 2009/0309176 | A1 * | 12/2009 | Akram et al. | 257/432 |
| 2010/0059791 | A1 * | 3/2010 | Takagi | 257/192 |
| 2012/0115327 | A1 * | 5/2012 | Miki | 438/667 |

FOREIGN PATENT DOCUMENTS

| JP | 63-155673 A | 6/1988 |
| JP | 6-326064 A | 11/1994 |
| JP | 2009-33097 A | 2/2009 |
| JP | 2009-290098 A | 12/2009 |

* cited by examiner

*Primary Examiner* — Charles Garber
*Assistant Examiner* — Ron Pompey
(74) *Attorney, Agent, or Firm* — Leydig, Voit & Mayer, Ltd.

(57) ABSTRACT

A first metal mask has a portion exposed at an opening of a second metal mask. The second metal mask is formed to be thicker than the first metal mask. The thickness of the first and second metal masks is such that the etching at an opening of the first mask reaches a source electrode when the etching at the opening of the second mask substantially reaches a semiconductor device forming layer.

11 Claims, 7 Drawing Sheets

METHOD OF MANUFACTURING VIA HOLE IN A SEMICONDUCTOR DEVICE

FIELD OF THE INVENTION

The present invention relates to a method of manufacturing a via hole and a method of manufacturing a semiconductor device having via holes.

BACKGROUND ART

A via hole structure is used to provide contact between a surface electrode and the back surface of a semiconductor substrate and is generally formed by first forming an opening (or recess) by etching from the back surface of the semiconductor substrate and then coating the inside of the opening with a metal layer. This structure eliminates the need for a wire bonding structure, making it possible to reduce the source inductance and hence improve the performance (high frequency characteristics) of the device.

The primary purpose of the via hole structure is to provide contact with a source electrode on the surface or an extension metal of the source electrode. Therefore, approximately a few micros of metal is formed along the inner walls of the via hole to ensure contact. Via hole structures are typically single holes having a uniform diameter. It should be noted that via holes need not necessarily be filled in with metal.

Prior art includes Japanese Laid-Open Patent Publication Nos. S63-155673, H06-326064, 2009-290098, and 2009-33097.

The heat dissipation characteristics of a semiconductor device may affect its performance. Specifically, for example, there are many high output power applications for semiconductor devices having a via hole structure, such as HEMTs and MMICs. In these applications, the upper limit of the temperature of the semiconductor channel primarily determines the maximum output power value of the device, making it important to improve the heat dissipation characteristics of the device in order to increase the maximum output power value.

As described above, since the primary purpose of the via hole structure is to provide contact with a source electrode on the surface, it is common to merely form a metal film along the inner walls of the via hole, instead of filling in the via hole with metal. However, the via hole structure may be filled in with metal in order to utilize the high thermal conductivity of the metal. This means that the heat dissipation characteristics of the device may be improved by filling the via hole with metal.

However, in a via hole structure consisting of one uniform diameter via hole, the via hole is made to extend vertically to an electrode on the surface, meaning that the area of the opening of the via hole is determined by the area of the electrode. That is, in the case of a via hole structure consisting of one uniform diameter via hole, the area of the opening of the via hole cannot exceed the area of the electrode on the surface. This limits the amount of metal that can be accommodated by the via hole structure consisting of one uniform diameter via hole. As a result, the metal filling the via hole structure has only a limited effect in improving the heat dissipation characteristics of the device.

One way to overcome this problem may be to form a via hole structure consisting of a multilevel recess including a first level recess for contact and a second level recess having a greater diameter than the first level recess (that is, to form a via hole structure having different diameter sections). An increased amount of metal can be buried in this via hole structure without disturbing the contact between the structure and the electrode on the surface. Thus this via hole structure having a plurality of different diameter sections has improved heat dissipation characteristics.

In this connection, the above Japanese Laid-Open Patent Publication No. S63-155573 describes a via hole structure with a stepped cross-sectional configuration formed in a semiconductor substrate and filled with metal. Further, the above Japanese Laid-Open Patent Publication No. H06-326064 describes a technique of forming a via hole having a cross-sectional shape including a plurality of steps in order to ensure adequate step coverage, although this via hole is not filled in with metal. However, these publications make no mention of improvement of heat dissipation characteristics.

When a via hole structure consisting of a plurality of recesses (or sections) including a first level recess for contact and a second level recess having a greater diameter than the first level recess is to be formed, it is necessary to solve the problem of how to form the multiple steps. For example, if such a plurality of steps are formed by simply repeating individual etch processes, the number of processes and hence the manufacturing time increase proportionally to the number of steps. In view of the manufacture of actual products, there is a need to provide a method of manufacturing a via hole structure having a plurality of different diameter sections as described above while suppressing an increase in the number of processes and in the processing time.

The present invention has been made to solve the above problems. It is, therefore, an object of the present invention to provide a via hole manufacturing method for manufacturing a via hole structure which is filled with an increased amount of filling material, thereby improving the heat dissipation characteristics, while suppressing an increase in the number of processes or in the processing time. Another object of the present invention is to provide a method of manufacturing a semiconductor device having such via holes.

SUMMARY OF THE INVENTION

According to a first aspect of the present invention, a method of manufacturing a via hole includes a mask providing step, an etching step, and a filling-in step. The mask providing step provides a mask on a back surface of a semiconductor substrate having an electrode on a top surface thereof. The etching step performs etching of the back surface of the semiconductor substrate using the mask to form a via hole opening. The filling-in step fills in the via hole opening with conductive material having thermal conductivity to form the via hole. Wherein the mask includes a first mask layer having a first opening exposing a portion of the back surface of the semiconductor substrate, the portion facing the electrode. Wherein the mask further includes a second mask layer provided on the first mask layer and having a second opening larger than the first opening. The second opening exposes a portion of the first mask layer. Wherein the thickness of the first mask layer is such that, in the etching step, the portion of the semiconductor substrate exposed at the first opening is etched to a predetermined depth when the exposed portion of the first mask layer exposed at the second opening has been etched away. Wherein the predetermined depth is such that, in the etching step, the etching at the first opening reaches a surface of the electrode when a semiconductor layer has been etched down to a predetermined thickness by the etching at the second opening.

According to a second aspect of the present invention, a method of manufacturing a semiconductor device having a via hole includes a step of providing a semiconductor substrate having the semiconductor device formed therein and a step of forming the via hole in the semiconductor substrate in accordance with the via hole manufacturing method of the first aspect. The via hole connects between the semiconductor device and the back surface of the semiconductor substrate.

In accordance with the first aspect of the present invention, a plurality of levels of etching can be accomplished on the semiconductor substrate collectively by continuous etching using the mask described above. As a result, it is possible to manufacture a via hole which is filled with an increased amount of filling material, thereby improving the heat dissipation characteristics, while suppressing an increase in the number of processes or in the processing time.

In accordance with the second aspect of the present invention, it is possible to manufacture a semiconductor device having via holes which are filled with an increased amount of conductive material so as to improve their heat dissipation characteristics, thereby improving the heat dissipation characteristics of the device, while suppressing an increase in the number of processes or in the processing time.

DETAILED DESCRIPTION OF THE PREFERRED EMBODIMENTS

Figure 1:
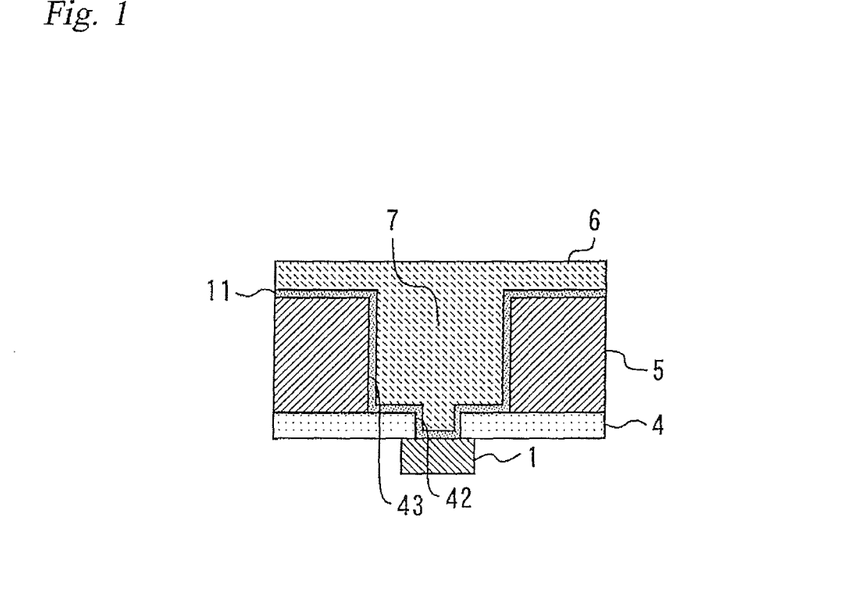
FIG. 1 is a cross-sectional view showing the structure of a via hole manufactured in accordance with a via hole manufacturing method of an embodiment of the present invention.

Embodiment
[Configuration of Via Hole of Embodiment]
FIG. 1 is a cross-sectional view showing the structure of a via hole manufactured in accordance with a via hole manufacturing method of an embodiment of the present invention. (It should be noted that the via hole structure is shown in an inverted orientation in FIG. 1.) Specifically, FIG. 1 shows a cross-section of a source electrode portion of a semiconductor device, which portion is filled with high heat-dissipative metal. The cross-sectional view of the semiconductor structure shown in FIG. 1 shows a source electrode 1, a first level via hole recessed portion (or first level via hole section) 42 for source contact, a second level via hole recessed portion (or second level via hole section) 43, a semiconductor device layer 4 (an epitaxial growth layer in the present embodiment), a sapphire substrate 5, a solder contact portion 6, a buried layer 7, and a seed layer 11 for electrolytically plating metal (Au) which forms the buried layer 7.

The via hole recessed portion 42 and the via hole recessed portion 43 have different diameters. That is, the entire hole made up of these via hole recessed portions 42 and 43 has a step-like vertical cross-section. This hole having a step-like configuration is filled with the buried layer 7, thereby forming a via hole for connecting the back surface of the sapphire substrate 5 to the source electrode 1. The via hole recessed portion 42 has a pattern width narrower than the pattern width of the source electrode 1. This prevents unexpected contact of the via hole with other components. The width of the via hole recessed portion 43 (i.e., the area of the opening of the via hole at the back side of the sapphire substrate 5) is greater than the width of the via hole recessed portion 42.

Thus, the second level via hole recessed portion 43 is provided in the device and is filled with the buried layer 7, thereby greatly improving the thermal conductivity (and heat dissipation) of the device.

That is, the purpose of ordinary via holes is to provide contact with the source electrode 1 on the surface, and this purpose can be accomplished by the via hole recessed portion 42 alone. In that case (i.e., when the via hole includes only the via hole recessed portion 42), however, the entire diameter of the via hole is limited by the diameter of the source electrode 1, making it impossible to fill the via hole with the buried layer 7 in enough volume to promote heat dissipation. Therefore, the via hole recessed portion 42 (filled with a buried layer) can provide only a limited heat dissipation improvement. Specifically, for example, let it be assumed that the first level via hole recessed portion 42 is a circular pattern and has a diameter of 20 um, and there are one hundred of such via hole recessed portions 42 disposed in the same plane. Further, the sum of the thicknesses of the sapphire substrate 5 (thermal conductivity: 35 $W*m^{-1}*K^{-1}$) and the semiconductor device forming layer (epitaxial growth layer) is assumed to be 100 um, and the volume of the entire semiconductor device is assumed to be 0.1 $mm^2$. In this case, when the via holes are fully filled with metal serving as the buried layer 7, the ratio of the volume of the buried layer 7 (thermal conductivity: 320 $W*m^{-1}*K^{-1}$) to the volume of the entire device is approximately 3.1%, and the average thermal conductivity is 43.5 $W*m^{-1}*K^{-1}$. This thermal conductivity is only approximately 1.25 times the thermal conductivity of the sapphire substrate alone (i.e., there is only a limited improvement).

On the other hand, when a second level via hole recessed portion (as described above) having a diameter of 60 um is further provided in the device, the ratio of the volume of the buried layer 7 to the volume of the entire device can be increased to approximately 28%. As a result, the average thermal conductivity can be increased to 111 $W*m^{-1}*K^{-1}$ which is approximately 3 times the average thermal conductivity of the device without the second level via hole recessed portion. Thus, the formation of the second level via hole recessed portion can greatly improve the average thermal conductivity.

[Manufacturing Method of Embodiment]

FIGS. 2 to 7 are diagrams illustrating a method of manufacturing a via hole and a method of manufacturing a semiconductor device having via holes in accordance with the present embodiment.

In accordance with the present embodiment, first a metal mask 8, a seed layer 9, and a metal mask 10 are formed on the back side of a sapphire substrate 5. (It should be noted that the via hole is shown in an inverted orientation in FIG. 2.) The metal mask 8 is used to form a first level via hole section. The metal mask 10 is used to form a second level via hole section. In accordance with the present embodiment, the seed layer 9 is made of Au/Ti.

Figure 2:
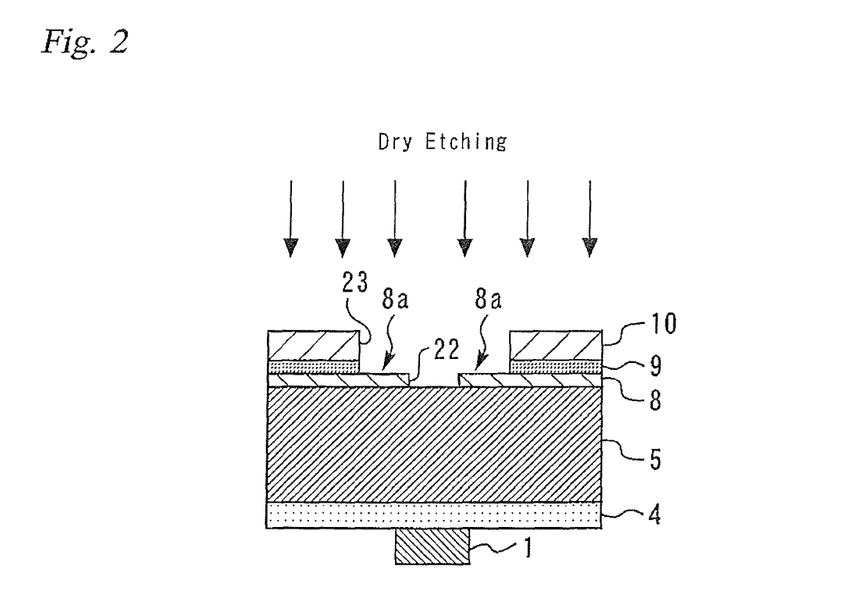
FIG. 2 is a diagram illustrating a method of manufacturing a via hole and a method of manufacturing a semiconductor device having via holes in accordance with an embodiment.

In accordance with the present embodiment, metal masks 8 and 10 are formed of nickel (Ni). The metal mask 8 has an opening 22 exposing a portion of the sapphire substrate 5. This exposed portion at the opening 22 faces the portion of the source electrode 1 which is to be contacted by the via hole. The metal mask 8 has a portion 8a exposed by an opening 23 of the metal mask 10.

The metal mask 10 is formed to be thicker than the metal mask 8. In accordance with the present embodiment, the thickness of the metal mask 10 is such that the etching at the opening 22 reaches the source electrode 1 when the etching started at the exposed portion 8a of the metal mask 8 within the opening 23 substantially reaches the semiconductor device forming layer 4.

Next, dry etching of the structure shown in FIG. 2 is initiated. In accordance with the present embodiment, this dry etching uses etching gas containing F or Cl.

Figure 3:
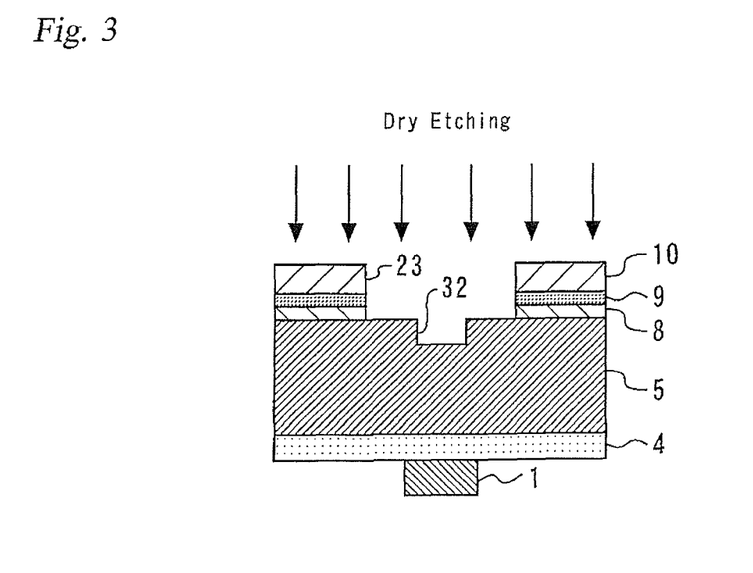
FIG. 3 is a diagram illustrating a method of manufacturing a via hole and a method of manufacturing a semiconductor device having via holes in accordance with an embodiment.

FIG. 3 is a diagram showing the structure of FIG. 2 when the dry etching is halfway complete. As a result of the progress of the dry etching of the structure of FIG. 2, the portion 8a of the metal mask 8 is etched away, and a recess 32 having a configuration corresponding to that of the opening 22 is formed in the sapphire substrate 5. (This recess 32 corresponds to the via hole recessed portion 42.)

Figure 4:
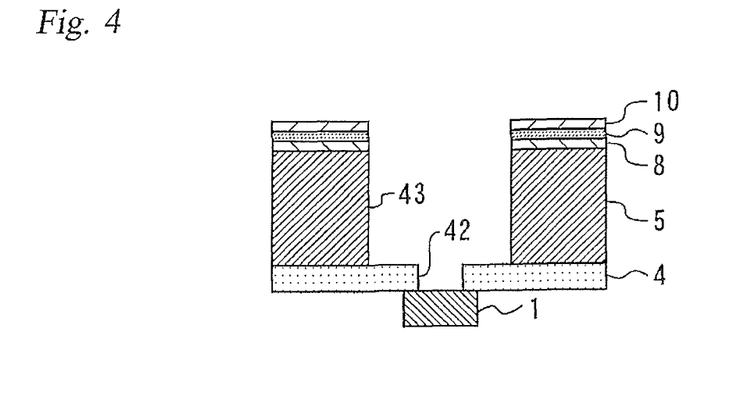
FIG. 4 is a diagram illustrating a method of manufacturing a via hole and a method of manufacturing a semiconductor device having via holes in accordance with an embodiment.

FIG. 4 is a diagram showing the structure of FIG. 3 after it has been further etched. Specifically, as a result of the progress of the dry etching of the structure of FIG. 3, the exposed portion of the sapphire substrate 5 within the opening 23 of the metal mask 10 is uniformly etched, thereby forming the via hole recessed portion 43 and the via hole recessed portion 42. Thus, the structure shown in FIG. 4 is formed by this single etching process, which has been started as shown in FIG. 2.

Next, the metal mask 8, the Ti/Au seed layer 9, and the metal mask 10 are removed by wet etching.

Figure 5:
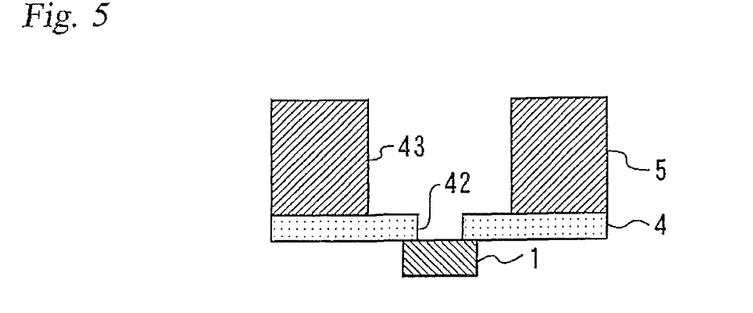
FIG. 5 is a diagram illustrating a method of manufacturing a via hole and a method of manufacturing a semiconductor device having via holes in accordance with an embodiment.

FIG. 5 is a diagram showing the structure after the above wet etching is complete. As shown, this via hole structure has two different diameter sections one on top of the other.

The seed layer 11 is then formed on the structure shown in FIG. 5 by sputtering.

Figure 6:
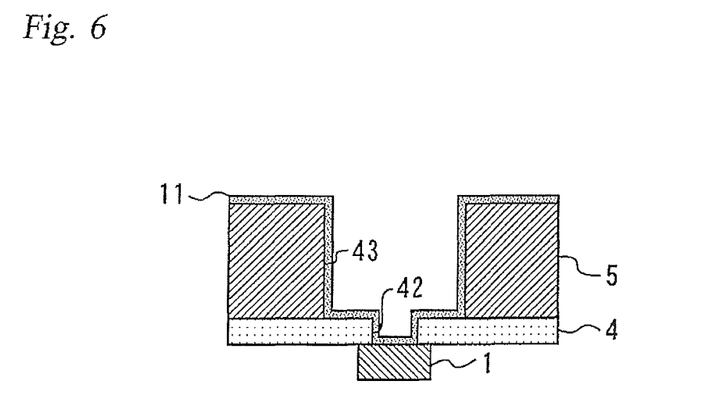
FIG. 6 is a diagram illustrating a method of manufacturing a via hole and a method of manufacturing a semiconductor device having via holes in accordance with an embodiment.

FIG. 6 shows the structure after the formation of the seed layer 11. This structure is then filled in with metal (Au) by electrolytic plating.

Figure 7:
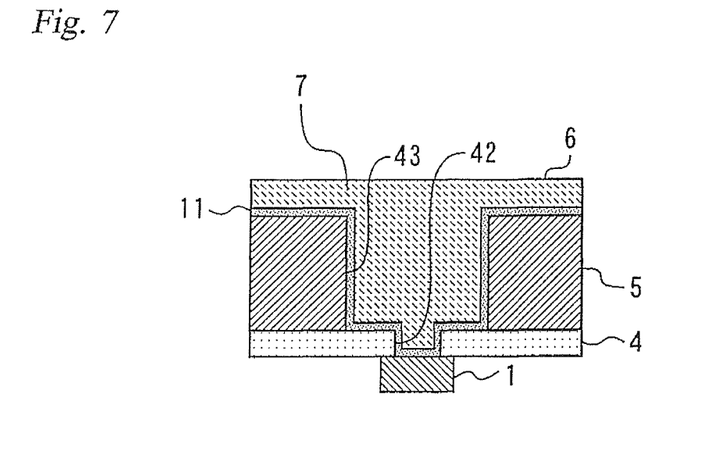
FIG. 7 is a diagram illustrating a method of manufacturing a via hole and a method of manufacturing a semiconductor device having via holes in accordance with an embodiment.

FIG. 7 is a diagram showing the structure after it is filled in with the buried layer 7.

Thus the above process forms the via hole of the present embodiment. The formation of the via hole results in the completion of electrical connection with the source electrode 1, thus completing the manufacture of the semiconductor device including the source electrode 1. Various post-processes are subsequently performed to eventually complete the desired product (package).

(Mask Forming Process)

FIGS. 9 to 16 are diagrams showing the mask forming process used by the via hole manufacturing method of the present embodiment. Specifically, this process is used to provide the structure shown in FIG. 2. The process includes steps (1) to (8) below for providing the structure shown in FIG. 2.

Figure 9:
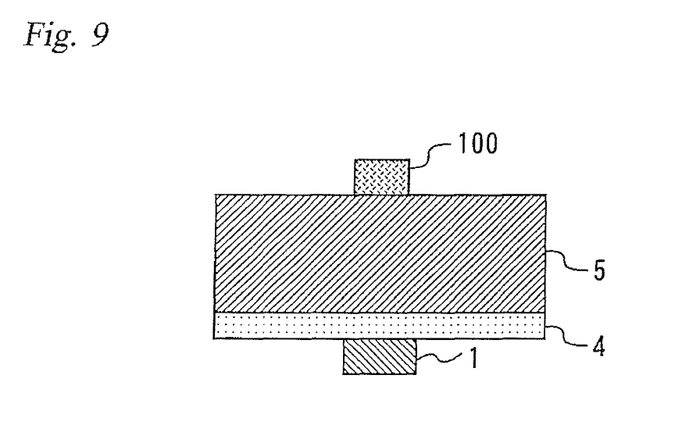
FIG. 9 is a diagram showing a mask forming process used by the via hole manufacturing method of an embodiment.

(1) A resist 100 serving as a pattern for the first level via hole section is formed by transfer printing, as shown in FIG. 9.

Figure 10:
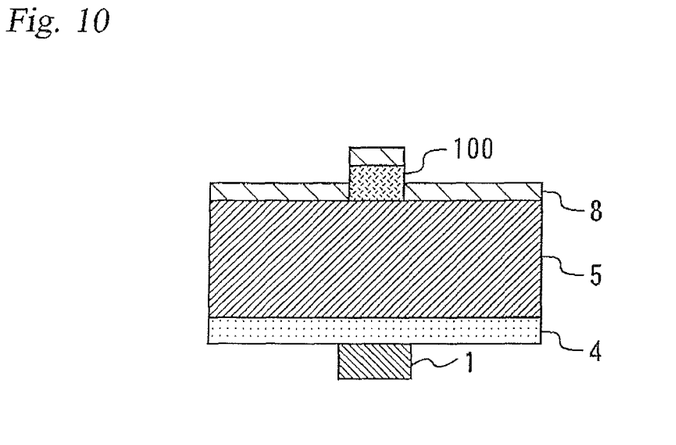
FIG. 10 is a diagram showing a mask forming process used by the via hole manufacturing method of an embodiment.

(2) Ni is then sputtered or deposited to form a first level metal mask 8, as shown in FIG. 10.

Figure 11:
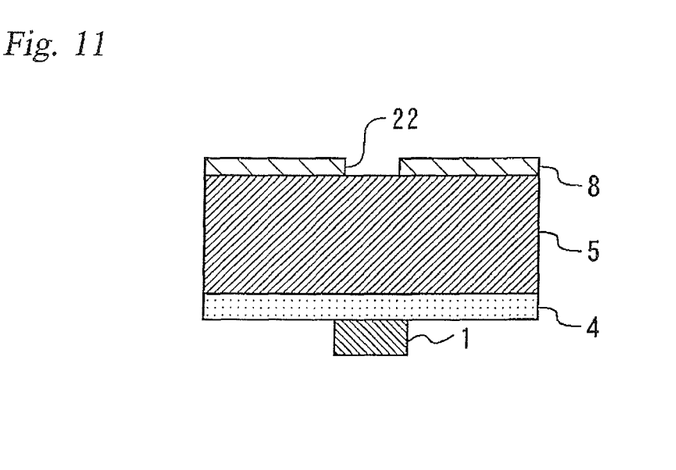
FIG. 11 is a diagram showing a mask forming process used by the via hole manufacturing method of an embodiment.

(3) The resist 100 formed in the above step (1) is then removed by lift-off, thereby forming a pattern for the first level via hole section. This forms the opening 22 of the metal mask 8, as shown in FIG. 11.

Figure 12:
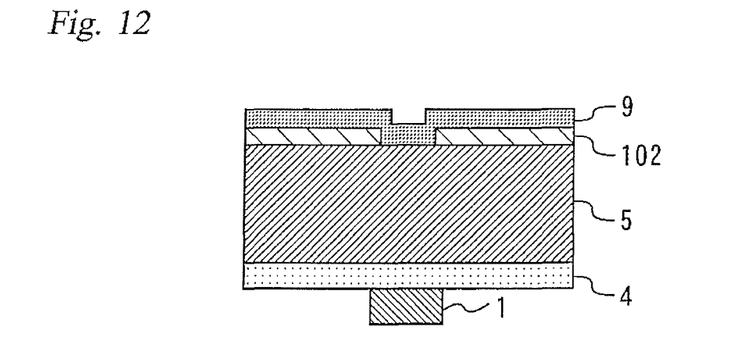
FIG. 12 is a diagram showing a mask forming process used by the via hole manufacturing method of an embodiment.

(4) A seed layer 9 is then formed, as shown in FIG. 12. In accordance with the present embodiment, the seed layer 9 is formed by sputtering or depositing Au/Ti. The seed layer 9 is used when forming the overlying mask by electroless plating or electrolytic plating.

Figure 13:
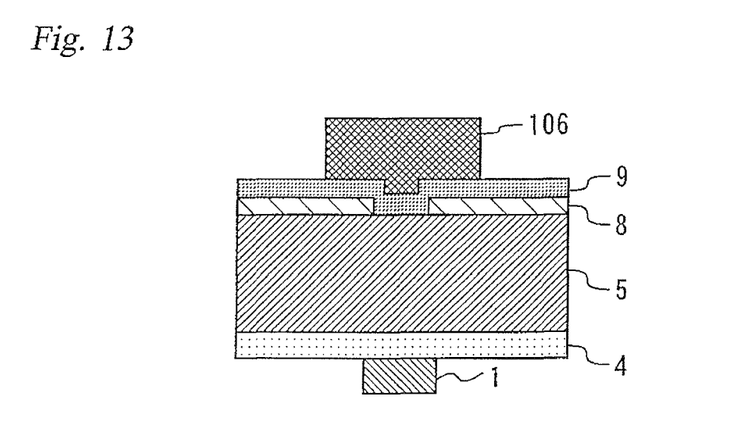
FIG. 13 is a diagram showing a mask forming process used by the via hole manufacturing method of an embodiment.

(5) A resist 106 serving as a pattern for the second level via hole section is then formed by transfer printing, as shown in FIG. 13.

Figure 14:
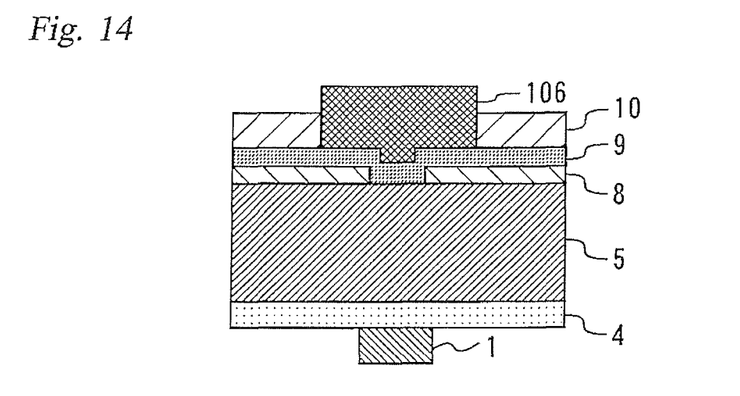
FIG. 14 is a diagram showing a mask forming process used by the via hole manufacturing method of an embodiment.

(6) A thick second level metal mask 10 of Ni is then formed by electroless plating or electrolytic plating, as shown in FIG. 14.

Figure 15:
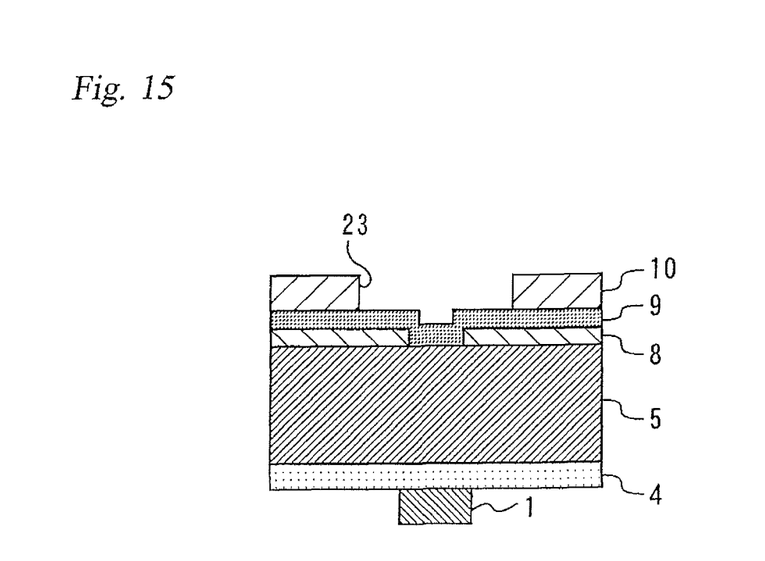
FIG. 15 is a diagram showing a mask forming process used by the via hole manufacturing method of an embodiment.
Figure 16:
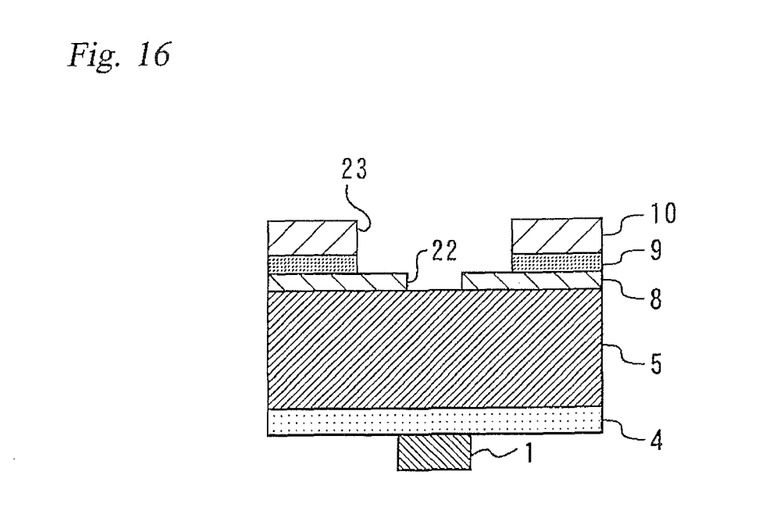
FIG. 16 is a diagram showing a mask forming process used by the via hole manufacturing method of an embodiment.

(7) The resist 106 formed in the above step (5) is then removed by lift-off, thereby forming a pattern for the second level via hole section. This forms the opening 23 of the metal mask 10, as shown in FIG. 15.

(8) The portion of the seed layer 9 in the pattern for the second level via hole section (i.e., the exposed portion of the seed layer 9) is then removed by ion milling (or any other dry etching technique). This produces the structure shown in FIG. 16, which corresponding to the structure shown in FIG. 2.

(Method for Designing Masks)

Figure 17:
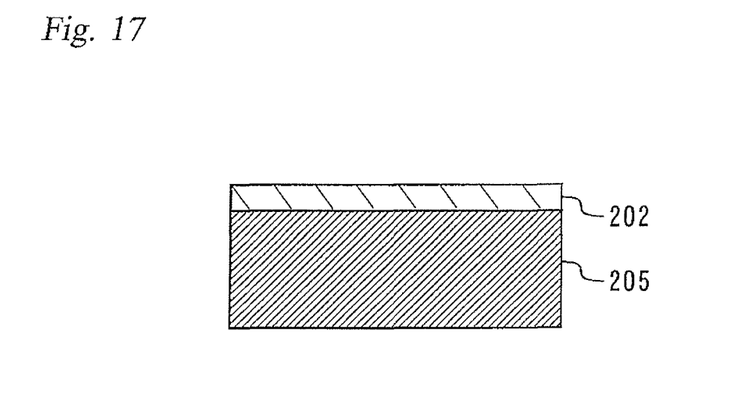
FIG. 17 is a diagram illustrating a method of determining the thicknesses of the masks of an embodiment.
Figure 18:
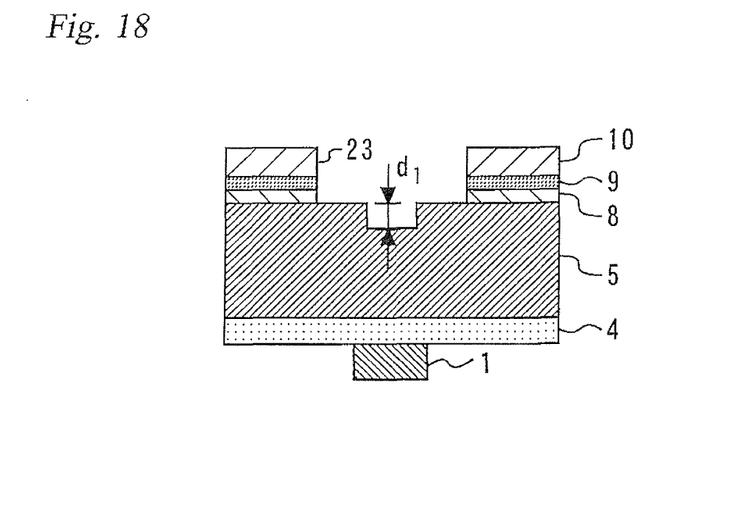
FIG. 18 is a diagram illustrating a method of determining the thicknesses of the masks of an embodiment.

FIGS. 17 and 18 are diagrams illustrating a method of determining the thicknesses of the masks of the present embodiment. In accordance with the present embodiment, the thicknesses of the metal masks 8 and 10 are determined in the following manner. The thicknesses of the metal masks 8 and 10 maybe determined based on their etch selectivity ratios (relative to the substrate to be etched). Specifically, these thicknesses are determined by quantitative experiments. For example, the following describes an exemplary method for determining the thickness of the metal mask 8 in order to achieve the desired depth of the first level via hole section.

1. A rate checking film 202 is formed on a substrate 205 to be etched (made of sapphire in this example), as shown in FIG. 17. For example, an Ni film is formed on the substrate 205. Any film forming method can be used, but it is preferable to use the same film forming method as that used in the actual manufacturing process.

2. The substrate with the Ni film thereon is then etched in order to determine the etching rate. The thickness of the Ni film on the substrate is measured before and after the etching, and the difference between these measured values is calculated.

3. The sapphire substrate 205 is then etched in order to determine the etching rate.

4. The film selectivity ratio is determined by the following equation:

Film selectivity ratio (Ni)=Etching rate of mask (Ni)/ Etching rate of the substrate 205 to be etched 5. The thickness (denoted by $H_1$ for convenience) of the metal mask 8 of Ni (for forming the first level via hole section) is determined based on the above determined film selectivity ratio and the desired etch depth $d_1$ shown in FIG. 18 by use of the following equation.

$H_1 = d_1$/Film selectivity rate (Ni)

It should be noted that the thicknesses of the metal masks for forming second and higher level via hole sections may be determined by the same procedure.

It should be noted that in accordance with the present embodiment the metal mask 10 is thicker than the metal mask 8. Three reasons for this are as follows.

One is to prevent etching away of material from the source electrode 1. However, although removal of the entire source electrode 1 results in conduction failure, etching away of some portion of the source electrode 1 may be permitted if that portion does not penetrate through the source electrode 1.

Another reason is that the region masked by the metal mask 10 should not be etched (in order to form a pattern).

Another reason is that in accordance with the present embodiment, the seed layer 9 underlying the metal mask 10 is Au/Ti. If this material is etched, unexpected contamination of the dry etcher may result.

It will be noted that in order to form a via hole having three or more different diameter sections, the above procedure of the present invention may be further repeated. Specifically, the above procedure for determining the thickness of a mask is repeated a number of times equal to the desired number of such via hole sections to determine the thicknesses of the masks for these via hole sections. The masks are then manufactured, and the via hole sections (or recessed portions) are formed by a single continuous etching process using the masks, as described in connection with the above embodiment. After the formation of the via hole sections, they may be filled in with metal, etc., completing the manufacture of the via hole.

Thus the above manufacturing method can be used to form the via hole of the present embodiment. Further, the formation of the via hole results in the completion of electrical connection with the source electrode 1, thus completing the manufacture of the semiconductor device including the source electrode 1. Various post-processes are subsequently performed to eventually complete the desired product (package).

By using the metal masks 8 and 10, a plurality of levels of etching can be accomplished on the semiconductor substrate collectively in a continuous etching process. As a result, it is possible to manufacture a via hole which is filled in with an increased amount of filling material, thereby improving the heat dissipation characteristics, while reducing the number of etching processes required to form the via hole in the semiconductor substrate.

Since the via hole structure of the present embodiment includes the via hole recessed portion 43 in addition to the via hole recessed portion 42, the via hole can be filled in with an increased amount of metal regardless of the size of the area of the electrode on the surface, which is not the case with via holes consisting of only the via hole recessed portion 42 (i.e., consisting of one uniform diameter hole). This can greatly improve the heat dissipation characteristics. For example, the via hole of the present embodiment can be used to increase the output power of power devices, which must have high heat dissipation characteristics.

It should be noted that the technique described in Japanese Laid-Open Patent Publication No. H06-326064 may be used to form a via hole having two different diameter sections. Specifically, this publication discloses a method in which first a first level via hole section is formed by use of a metal mask, and higher level via hole sections having successively smaller diameters are then formed by etching and by application of insulating films. In this case, however, the number of etching steps increases proportionally to the number of different diameter via hole sections, and furthermore the formation of the insulating films is troublesome.

In the semiconductor device structure of the present embodiment, on the other hand, a via hole having two or more different diameter sections can be formed collectively by continuous dry etching. That is, a via hole having any number of different diameter sections can be formed by a single etching process.

Therefore, when forming the seed layer 11, for example, if multiple steps (different diameter sections) are to be formed near the surface in order to improve the step coverage, it is possible to form these steps without an increase in the number of processes and in the processing time.

Specifically, if multiple steps (namely, three or more steps, two or more different diameter sections) are to be formed to improve the step coverage when forming the seed layer 11, the manufacturing method of the present embodiment may be used to form these steps (different diameter sections) with a limited increase in the number of processes and in the processing time, since the method is advantageous in that the number of such steps can be increased without requiring an increase in the number of etching processes.

The following should be noted: the source electrode 1 of the embodiment described above corresponds to the electrode of the first aspect of the invention described in the Summary of the Invention section; the sapphire substrate 5 corresponds to the semiconductor substrate of the first aspect; the metal masks 8 and 10 correspond to the mask of the first aspect; the opening including the via hole recessed portions 42 and 43 corresponds to the via hole opening of the first aspect; and the buried layer 7 corresponds to the conductive material having thermal conductivity in the first aspect.

Further, the metal mask 8 of the embodiment described above corresponds to the first mask layer of the first aspect of the invention; the metal mask 10 corresponds to the second mask layer of the first aspect; the opening 22 corresponds to the first opening of the first aspect; the opening 23 corresponds to the second opening of the first aspect; the portion 8*a* corresponds to the exposed portion of the first aspect; the thickness $H_1$ corresponds to the thickness in the first aspect; and the depth $d_1$ corresponds to the predetermined depth in the first aspect.

[Variations of Embodiment]

Figure 8:
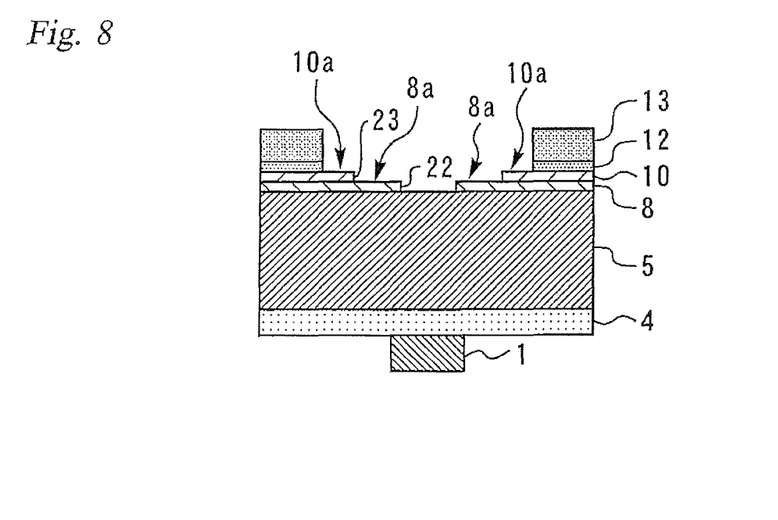
FIG. 8 is a diagram showing a variation of an embodiment.

FIG. 8 is a diagram showing a variation of the present embodiment. The present embodiment provides a via hole structure having two different diameter sections. In this variation, a third level metal mask 13 has been added to the via hole structure of the present embodiment, as shown in FIG. 8. The third level metal mask 13 is related to the second level metal mask 10 in the same manner as the second level metal mask 10 is related to the first level metal mask 8, making it possible to form a via hole having three different diameter sections by use of these masks. In this case, first the portion 8*a* of the metal mask 8 and then a portion 10*a* of the metal mask 10 are removed by dry etching. This dry etching process is further continued to form a via hole having three different diameter sections. Via holes having 4, 5, . . . n different diameter sections can be formed in a similar manner. In any case, the via hole may be filled in with the buried layer 7 so as to improve the heat dissipation characteristics, as is the case with the via hole having two different diameter sections in accordance with the present embodiment.

It should be noted that in accordance with the above embodiment the second level recessed portion of the via hole structure may be formed in such a manner that its depth extends just up to the semiconductor device-forming semiconductor layer. Thus the portion of the via hole structure which is to be filled in with metal has the largest depth which is possible without removing material from the semiconductor device-forming semiconductor layer. Specifically, in accordance with the embodiment described above, the via hole recessed portion 43 is formed by etching in such a manner that it extends just up to the epitaxial layer 4, so that the via hole recessed portion 43 can accommodate the largest possible amount of metal (serving as the buried layer 7) and thereby provide the greatest possible heat dissipation. However, the present invention is not limited to this particular arrangement. The second level recessed portion of the via hole structure may be formed to extend a certain distance short of the semiconductor device-forming semiconductor layer, with the distance serving as a margin of safety. This reliably prevents removal of material from the semiconductor device-forming semiconductor layer. That is, the via hole recessed portion 43 may be formed to extend only halfway into the sapphire substrate 5 covering the epitaxial layer 4, if some sacrifice of heat dissipation is tolerated. This via hole structure can also achieve heat dissipation improvement when it is filled in with the buried layer 7.

It should be noted that the metal masks 8 and 10 of the above embodiment may be replaced by masks of metal other than Ni, such as Cr or Al. These masks may not be made of the same metal. That is, these two masks (corresponding to the metal masks 8 and 10) may be of different types of metals.

When the metal masks 8 and 10 are of different types of metals, the metal mask 10 need not necessarily be thicker than the metal mask 8. In this case, their thicknesses may be determined in the following manner. First the etch selectivity ratios of the metal masks 8 and 10 relative to the substrate to be etched (i.e., the sapphire substrate 5 in the present embodiment) are determined, and then the thicknesses of these metal masks are determined by the following formula: (Etch selectivity ratio of metal mask 8×Thickness of metal mask 8)< (Etch selectivity ratio of metal mask 10×Thickness of metal mask 10).

The source electrode 1 of the embodiment described above may be a so-called "extension metal." An extension metal is an electrode connected to a source electrode and used to directly contact with a via hole located at a distance from the source electrode. That is, there are two types of via hole structures: the ISV (individual source via hole) structure formed directly under a source electrode; and the via hole structure formed under an extension metal which is connected to the source electrode by an airbridge electrode. Thus, in the latter structure (which uses an airbridge electrode), the extension metal, not the source electrode, is disposed at a position corresponding to the source electrode 1 shown in FIG. 1. However, since the extension metal is electrically connected to the source electrode, it can be regarded as a part of the source electrode. Therefore, an extension metal can be substituted for the source electrode 1 of the above embodiment.

Although the present embodiment has been described in connection with a via hole structure for providing contact with the source electrode 1, it is to be understood that the present invention is not limited to this particular structure. Specifically, the present invention is not limited to structures for providing contact with the source electrode, but may be applied to any structure for providing contact with an electrode (or an extension metal) on the surface of a semiconductor substrate.

Further, the above embodiment may be used to manufacture via hole structures for use in high frequency devices, such as MMICs (monolithic microwave integrated circuits) and HEMTs (high electron mobility transistors), various types of semiconductor active devices, and other semiconductor devices. There are many high output power applications for semiconductor devices having a via hole structure, such as HEMTs and MMICs. In these applications, the upper limit of the temperature of the semiconductor channel primarily determines the maximum output power value of the device, making it important to improve the heat dissipation characteristics of the device in order to increase the maximum output power value. The via hole structure of the embodiment described above provides great heat dissipation capability for the semiconductor device and thereby improves its characteristics, as well as reducing the source inductance and hence improving the performance (or high frequency characteristics) of the device.

In accordance with the above embodiment, the buried layer 7 of high heat dissipative metal (Au), together with the solder contact portion 6, is formed by electrolytic plating. This formation may also be accomplished by electroless plating, sputtering, or deposition.

In the above embodiment, the semiconductor substrate is a sapphire substrate 5. It is to be understood, however, that the present invention is not limited to this particular type of substrate. A semiconductor substrate of GaN, SiC, or Si may be substituted for the sapphire substrate 5.

The material for the semiconductor substrate may be GaN, SiC, Si, or sapphire having either a thermal conductivity of 200 $W*m^{-1}*K^{-1}$ or less, or an etch resistance, or both.

The requirement that the material for the semiconductor substrate have a thermal conductivity of 200 $W*m^{-1}*K^{-1}$ or less stems from the fact that metals used to fill the via hole, such as Cu, Ag, and Au, have a thermal conductivity of 320-420 $W*m^{-1}*K^{-1}$ and that when the via hole structure having two different diameter sections in accordance with the present embodiment is approximately 28% filled with such metal, there should be an approximately 30% increase in the thermal conductivity of the device. In other words, when the via hole structure is formed in a substrate having a thermal conductivity higher than 200 $W*m^{-1}*K^{-1}$ and filled in with metal such as Ag or Au, the resulting increase in the thermal conductivity of the device is not great enough to justify the cost of filling the via hole with the metal.

A material having an etch resistance is a material which, when subjected to dry etching, exhibits an etch rate of approximately 0.1-1 um/min primarily due to physical reaction. Examples of such materials include SiC and sapphire, that is, materials exhibit a very low etch rate when etched in Cl-based or F-based gas. Generally, materials having a high boiling point (namely, 1000° C. or more) tend to have an etch resistance.

It should be noted that the semiconductor layer, or semiconductor device forming layer, may be formed of a wide bandgap semiconductor having a wider bandgap than silicon. Examples of wide bandgap semiconductors include silicon carbide (SiC)- and gallium nitride (GaN)-based materials and diamond. Semiconductor devices (e.g., such as transistors, switching devices, and diode devices) formed of such a wide bandgap semiconductor can be of a reduced size since they have high dielectric strength and high current density capacity. Further, the reduced size of these switching devices and diode devices allows for a reduction in the size of the semiconductor modules containing them. Further, since wide bandgap semiconductors have high thermal resistance, it is possible to reduce the size of the radiating fins of heat sinks, or to use air cooling instead of water cooling, resulting in a further reduction in the size of the semiconductor modules. Further, since wide bandgap semiconductors provide low power loss, switching devices and diode devices formed of wide bandgap semiconductors have increased efficiency, making it possible to increase the efficiency of the semiconductor modules containing them.

It should be noted that a via hole may be shaped to have a forward tapered shape, not a cylindrical shape, in order to accommodate an increased amount of metal; that is, the diameter of the opening of the via hole on the substrate side is made larger than the diameter of the opening of the via hole facing the source electrode. This forward tapered shape may be formed by a technique utilizing the thermal degeneracy properties of a mask, which technique is used with resist masks.

However, metal masks are often used when dry-etching, e.g., etch-resistant materials and semiconductor materials such as GaN, SiC, and sapphire. In the case of metal masks, unlike resist masks, it is difficult to easily form a forward tapered shape by utilizing their thermal degeneracy properties.

This means that if a via hole adapted to be filled with an increased amount of metal is to be formed in a substrate of GaN, SiC, or sapphire by dry etching, it must be of the type having a plurality of different diameter sections, not the type having a forward tapered shape. Therefore, there is a great need for a method of manufacturing a via hole structure having a plurality of different diameter sections while suppressing an increase in the number of processes and in the processing time. The manufacturing method of the embodiment described above is useful for forming such a via hole in a semiconductor substrate of etch resistant material by dry etching using metal masks.

Further, the buried layer 7 may be formed of metal other than Au (e.g., high heat-dissipative metal such as Ag or Cu), or other conductive material. Further, the material for the buried layer 7 may be selected to have a thermal conductivity of 300 $W*m^{-1}*K^{-1}$ or more at room temperature. The reason for this is that when a via hole is formed in a semiconductor substrate of material having a thermal conductivity of 200 $W*m^{-1}*K^{-1}$ or less and is filled with metal having a thermal conductivity of 300 $W*m^{-1}*K^{-1}$, there will be a certain degree of improvement in the heat dissipation of the device. The above value of the thermal conductivity of the buried layer 7, namely, 300 $W*m^{-1}*K^{-1}$, has been determined by consideration of the fact that layers of Au, Ag, and Cu can be formed by electrolytic plating and have a high thermal conductivity, namely, 320 $W*m^{-1}*K^{-1}$.

In accordance with the above embodiment, the etching gas contains F or Cl. The reason for this is that gas containing F or Cl can generate nonvolatile substance, which ensures high selectivity when a metal mask is used. Some mask materials, when used in dry etching, generate a substance which vaporizes at room temperature or less due to chemical reaction (e.g., $AsF_3$ vaporizes at −50° C.), and this substance undergoes an elimination reaction. Therefore, in order to achieve high selectivity in dry etching, it is preferable to use a mask material that generates a substance which does not go into elimination reaction at room temperature. For example, Ni masks, when used in F-based etching gas, generates a nonvolatile substance such as $NiF_2$ (having a vaporization temperature of 1760 degrees). That is, suitable materials for metal masks are Ni, Cr, and Al, since these metals generate a nonvolatile substance when the masks are used in dry etching using F- or Cl-based gas and since they have high selectivity ratios relative to substrate material even under high power plasma conditions.

It is to be understood, however, that the present invention is not limited to these etching gases, and other etching gas may be used as necessary.

The manufacturing method of the embodiment described above uses metal masks for the following two reasons:

(1) In practice no resist material is reported or available which can be used to etch material such as SiC in high power plasma conditions with an antenna power of 1000 W. High power plasma is plasma generated in an etching system (typically, an ICP system) when its antenna power is 1000 W or more.

(2) When a via hole having two or more different diameter sections is formed, the mask for the first level section need be etched away in the first stage of the etching process. In order to accurately form steps, it is useful to use a method which is excellent in controlling a film thickness, such as deposition or sputtering. In this connection, metal masks can be formed by methods which are excellent in controlling a film thickness, such as deposition and sputtering.

It is to be understood, however, that the present invention is not limited to metal masks. Masks of other material can be used. For example, hard masks of insulating film materials such as SiO and SiN can also be formed to have a relatively highly controlled thickness and a relatively high etch selectivity ratio (relative to the substrate material). Therefore, hard masks of such insulating film materials may be used depending on the manufacturing conditions (e.g., when the semiconductor substrate material is GaAs).

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2010-248451, filed on Nov. 5, 2010 including specification, claims, drawings and summary, on which the Convention priority of the present application is based, are incorporated herein by reference in its entirety.

What is claimed is:

1. A method of manufacturing a via hole in a semiconductor device structure, comprising:
   providing a semiconductor device structure including a substrate having opposed top and bottom surfaces, a semiconductor device layer disposed on the top surface of the substrate, and a device electrode disposed on a surface of the semiconductor device layer that is opposite and spaced from the top surface of the substrate;
   forming a multiple layer mask on the back surface of the substrate by sequentially forming, at the back surface of the substrate, a first mask layer having an opening aligned with the device electrode on the surface of the semiconductor device layer and exposing part of the back surface of the substrate, and a second mask layer having an opening that is aligned with and larger in area than the opening in the first mask layer, wherein the opening in the second mask layer exposes part of the first mask layer and the part of the back surface of the substrate exposed by the opening in the first mask layer, and the first and second mask layers have respective first and second thicknesses and the first thickness is smaller than the second thickness;

etching, in a single continuous etching step, the back surface of the substrate in the opening of the first mask layer, the first mask layer exposed by the opening in the second mask layer, and part of the semiconductor device layer, including removing the part of the first mask layer exposed in the opening of the second mask layer to expose and etch an additional part of the back surface of the substrate during the etching, and, upon exposure of the semiconductor device layer, simultaneously etching the substrate and the semiconductor device layer, to form a via hole opening in the substrate and in the semiconductor device layer, wherein the via hole opening produced in the single continuous etching step has a stepped structure, with a larger-area portion and a smaller-area portion that is smaller in area than the larger-area portion, the via hole opening reaches the device electrode in the smaller-area portion of the via hole opening, and the first and second thicknesses are chosen so that the part of the back surface of the substrate that is exposed in the opening in the first mask layer is etched to a predetermined depth when the part of the first mask layer exposed in the opening in the second mask layer is removed in the etching, and so that the smaller-area portion of the via hole opening reaches the device electrode when the larger-area portion of the via hole opening reaches the semiconductor device layer; and filling the via hole opening with a thermally conductive material to form the via hole.

2. The method according to claim 1, wherein the semiconductor device layer has a thickness for forming a semiconductor device in the semiconductor device layer.

3. The method according to claim 1, wherein filling the via hole opening includes:

forming a seed layer on an inner wall of the via hole opening; and filling the via hole opening with the thermally conductive material by electrolytic plating the thermally conductive material on the seed layer, using the seed layer as a plating electrode of the electrolytic plating.

4. The method according to claim 1, wherein the substrate has at least one of a thermal conductivity not exceeding 200 $W*m^{-1}*K^{-1}$ and etch resistance.

5. The method according to claim 1, wherein the substrate is selected from the group consisting of GaN, SiC, Si, and sapphire.

6. The method according to claim 1, wherein the conductive material has a thermal conductivity of at least 300 $W*m^{-1}*K^{-1}$ at room temperature.

7. The method of according to claim 1, further comprising:

forming a semiconductor device in the semiconductors device layer, wherein the semiconductor device is electrically connected to the device electrode; and forming the via hole in the substrate so that the via hole electrically connects the semiconductor device to the back surface of the substrate via the device electrode.

8. The method according to claim 7, wherein the semiconductor device is one of a monolithic microwave integrated circuit (MMIC) and a high election mobility transistor (HEMT).

9. The method according to claim 7, wherein the semiconductor device includes a semiconductor channel and maximum output power of the semiconductor device is determined by an upper limit of temperature of the semiconductor channel.

10. A method of manufacturing a via hole in a semiconductor device structure, comprising:

providing a semiconductor device structure including a substrate having opposed top and bottom surfaces, a semiconductor device layer disposed on the top surface of the substrate, and a device electrode disposed on a surface of the semiconductor device layer that is opposite and spaced from the top surface of the substrate;

forming a multiple layer mask on the back surface of the substrate by sequentially forming, at the back surface of the substrate, a first mask layer having an opening aligned with the device electrode on the surface of the semiconductor device layer and exposing part of the back surface of the substrate, and a second mask layer having an opening that is aligned with and larger in area than the opening in the first mask layer, wherein the opening in the second mask layer exposes part of the first mask layer and the part of the back surface of the substrate exposed by the opening in the first mask layer, the first and second mask layers have respective first and second thicknesses, and (i) etch selectivity of the first mask layer relative to the substrate multiplied by the first thickness is less than (ii) etch selectivity of the second mask layer relative to the substrate multiplied by the second thickness;

etching, in a single continuous etching step, the back surface of the substrate in the opening of the first mask layer, the first mask layer exposed by the opening in the second mask layer, and part of the semiconductor device layer, including removing the part of the first mask layer exposed in the opening of the second mask layer to expose and etch an additional part of the back surface of the substrate during the etching, and, upon exposure of the semiconductor device layer, simultaneously etching the substrate and the semiconductor device layer, to form a via hole opening in the substrate and in the semiconductor device layer, wherein the via hole opening produced in the single continuous etching step has a stepped structure, with a larger-area portion and a smaller-area portion that is smaller in area than the larger-area portion, the via hole opening reaches the device electrode in the smaller-area portion of the via hole opening, and the first and second thicknesses are chosen so that the part of the back surface of the substrate that is exposed in the opening in the first mask layer is etched to a first predetermined depth when the part of the first mask layer exposed in the opening in the second mask layer is removed in the etching, and so that the smaller-area portion of the via hole opening reaches the device electrode when the larger-area portion of the via hole opening reaches a second predetermined depth; and filling the via hole opening with a thermally conductive material to form the via hole.

11. The method according to claim 10, wherein the first mask layer and the second mask layer are different metals, and the etch selectivity of the first mask layer relative to the substrate is different from the etch selectivity of the second mask layer relative to the substrate.

* * * * *